Figure 1:
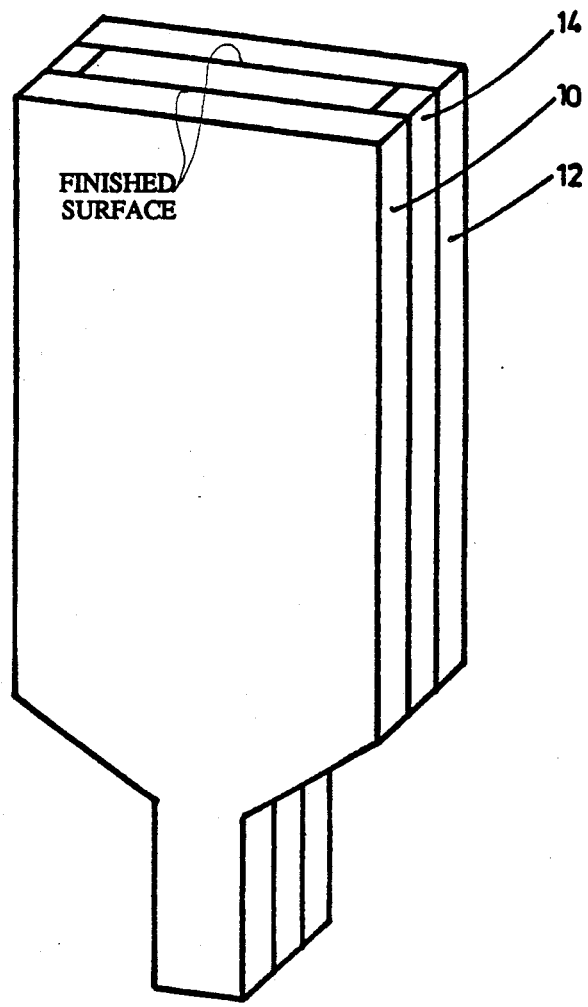

United States Patent [19]

Wisotzki

[11] Patent Number: 4,915,882
[45] Date of Patent: Apr. 10, 1990

[54] METHOD AND APPARATUS FOR MANUFACTURING MONOCRYSTAL REFLECTORS

[76] Inventor: Jurgen Wisotzki, Weserstrabe 7a, 6074 Rödermark-Urberach, Fed. Rep. of Germany

[21] Appl. No.: 830,025

[22] Filed: Jan. 11, 1985

[51] Int. Cl.⁴ .................. B29D 11/00; C22B 15/00
[52] U.S. Cl. ........................... 156/616.4; 75/72; 372/99; 350/607
[58] Field of Search ................ 148/32, 174; 75/72; 264/2.7, 162

[56] References Cited

U.S. PATENT DOCUMENTS

| | | | |
|---|---|---|---|
| 3,947,302 | 3/1976 | Grossman | 264/162 |
| 3,992,197 | 11/1976 | Watzold | 75/5 A |
| 4,192,695 | 3/1980 | Maballa | 148/32 |
| 4,231,827 | 11/1986 | Wilson | 264/2.7 |
| 4,312,667 | 1/1982 | Guertin | 75/72 |

*Primary Examiner*—Nelson Moskowitz
*Attorney, Agent, or Firm*—Larson and Taylor

[57] ABSTRACT

A method for manufacturing uniformly smooth monocrystal reflectors of copper, silver or gold for laser application using a crucible polished to optical quality on the surface in contact with the reflecting surface of the monocrystal.

3 Claims, 2 Drawing Sheets

METHOD AND APPARATUS FOR MANUFACTURING MONOCRYSTAL REFLECTORS

The invention relates to a process and an apparatus for the manufacture of monocrystal reflectors of copper, silver or gold for laser applications according to U.S. Ser. No. 837,868, which is a continuation of U.S. Ser. No. 522,336, filed on Aug. 10, 1983, and now abandoned, and based on German patent application P 32 29 697.5-51 as well as reflectors manufactured according to this process.

In the copending U.S. patent application it is proposed to employ monocrystal reflectors in laser applications in lieu of metal reflectors of polycrystalline material. Contrary to expectations it was found that monocrystal reflectors withstand much better the extreme thermal loads caused by laser beams.

Further experiments meanwhile have shown that the advantages inherent in the monocrystalline structure of the reflecting metal body are partially lost again during forming and/or machining as these operations modify the homogeneous crystalline texture to varying degrees. The negative effects of traditional polishing treatment, by which reflectivity in reflectors of polycrystalline material is enhanced normally, was noted accidentally when it was found that reflection produced by monocrystal reflectors was markedly better in the case of etched surfaces than in traditionally polished surfaces. Etched surfaces, however, are nonhomogeneous so that while of interest as protective shields against laser beams they do not lend themselves to optical or similar purposes in which a specific optical path requires a precisely defined reflecting surface.

In this situation the object of this invention is to provide a process by means of which monocrystal reflectors of optical quality may be produced without recourse to mechanical treatment as needed in polishing. The invention therefore proposes that the monocrystals are produced with a finished reflecting surface in a crucible polished to optical quality on the inside of its counter-surface.

The effect of the invention is based on the fact that when a monocrystal is grown in a crucible, e.g. by employing the Bridgeman-process, the monocrystal surfaces obtained upon melt solidification will represent accurate impressions of the crucible's forming surfaces. This is due to the fact that the solidification front of the growing crystal will tend to adhere to any unevenness and roughness on the crucible inside wall and, therefore, the crucible inside wall will become imprinted on the crystal surface. It is this quality that is utilized positively by this invention by proposing to polish the crucible wall to optical standard thus obviating the need for polishing the monocrystal grown in the crucible. Moreover, it is more economical to polish a forming crucible once rather than each workpiece individually.

In addition the invention offers the possibility of growing, virtually without extra cost, monocrystals incorporating opposite reflecting surfaces in a crucible having polished opposite inside surfaces. The outcome will be monocrystal reflectors having a reflecting surface at their front and rear. At practically invariant production cost these offer the advantage of allowing rotation when one face is damaged, thus having a service life twice as long.

The efficiency of the new process is particularly apparent when in the preferred embodiment at least on one lateral face mirror-like monocrystals are grown whose length is a multiple of the length of the reflector to be produced and when the monocrystal is then separated into several reflectors. Separating the monocrystal by cutting it into several smaller reflectors has no adverse effect upon the reflecting surfaces or the underlying crystal structure. The outstanding qualities of these reflecting monocrystals, reflectivity and optimal conductivity, given the absence of grain boundaries in the crystal lattice, are thus preserved. Similarly, irregular stresses in the material during cutting of the monocrystal can be avoided so that deformation as a result of heating under beam load need not be anticipated. The square or rectangular shape of reflectors, resulting from cutting a larger monocrystal, presents no practical drawback over the conventional round shape. It merely requires adaptation of the reflector mounting.

One characteristic feature of a monocrystal reflector according to this invention, regardless whether formed as a single piece or separated from a larger monocrystal, is its reflecting surface consisting of an unworked monocrystal structure. This natural surface, undamaged and without polishing marks, offers the greatest resistance to impinging laser rays as there are neither irregularities nor inhomogenities in the material and as no material is "smeared" over its surface, usually the case with polishing, which might evaporate under the effect of a laser beam, rendering the reflector blind so that it would reflect less and absorb more light, ultimately being overheated and destroyed.

Drawing of monocrystals in forming crucibles has been described previously in U.S. patent application Ser. No. 640,144, filed June 4, 1984. This process makes it possible to obtain virtually any type of surface or shapes directly during the transition from the liquid to the solid state of the metal so that the finished product is obtained without any subsequent forming or machining, associated with irregular stresses in the material. This will apply, under this invention, even when the final product is intended to have one or several reflecting surfaces inasmuch as it will suffice to polish at least one inside surface of the crucible to optical standard. Vitreous graphite (glass graphite, glass coal), as obtainable from graphite suppliers for crucibles, was found to be best suited as crucible material. This material permits machining and polishing treatment. Depending on whether the polished inside crucible surfaces have plane or curved shape, any monocrystal grown in the crucible will be given a reflecting surface of corresponding shape.

The crucible is preferably made up of several component parts for ease of machining and polishing. These parts are then assembled to form the required crucible and are held together by bolts or clamps. An advantage of this crucible construction is that inside surfaces are easily accessible for machining.

The process of growing monocrystals in graphite crucibles, usually by the Bridgeman process using protective gas, is sufficiently well known, therefore no description is included.

Figure 3:
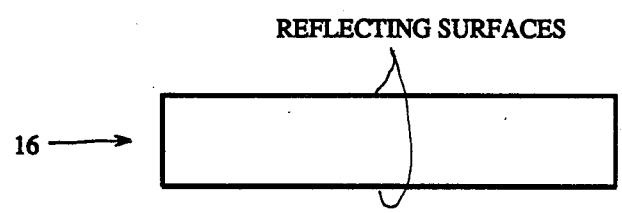
Figure 2:
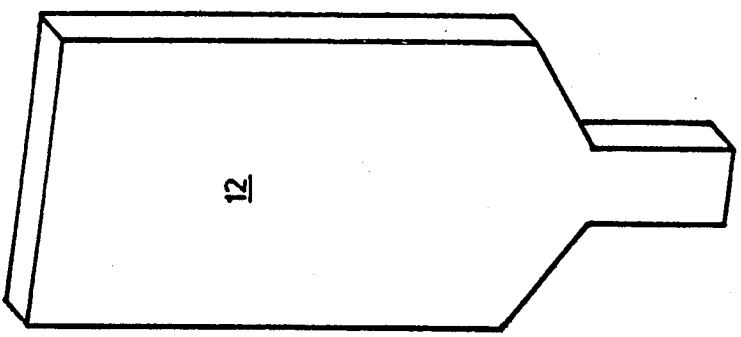
Figure 2:
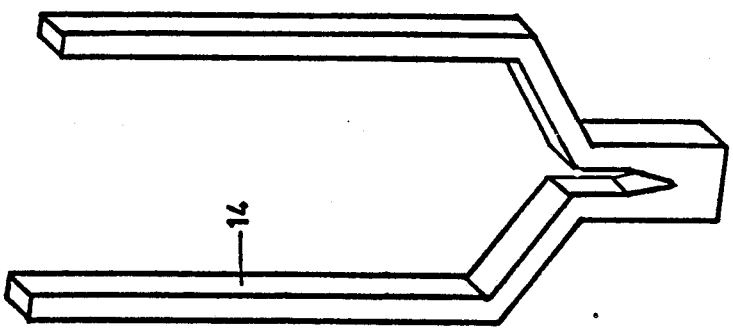
Figure 2:
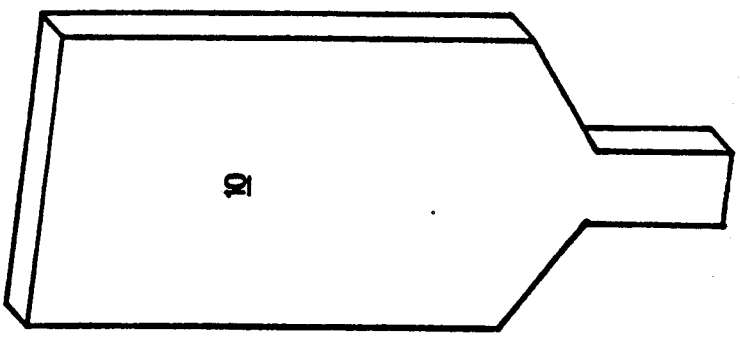

The enclosed drawing illustrates the construction of a crucible for making monocrystal reflectors according to this invention. FIG. 1 shows the crucible in its assembled form while FIG. 2 shows the component parts of the crucible in perspective and FIG. 3 shows an end view of a reflector produced by the crucible of FIGS. 1 and 2.

The crucible illustrated consists of two flat side sections 10 and 12 and a fork-like middle section 14. These three crucible sections, assembled as in FIG. 1, are held together by clamps, not shown. The crucible cavity, enclosed by these sections, has a constant flat rectangular cros-section from the top downwards and tapers at the lower end, across oblique surfaces, into a narrow tip into which a germ crystal is placed at the beginning of the process and by means of which the orientation of the monocrystal to be grown is determined.

In the case illustrated here the inside surfaces of both crucible sections 10 and 12 are polished so that the monocrystals produced in the crucible will be given a surface quality identical to that of the polished surfaces. In this manner a monocrystal with reflecting surfaces on opposite sides, as illustrated in FIG. 3, is obtained.

The invention is not bound to any specific process for growing monocrystals. One skilled in the art has at his disposal a number of different processes. The important thing is that monocrystals are grown in a crucible having inside surfaces machined to exacting surface standards permitting reflecting surfaces of optical quality to be obtained.

At the present time such monocrystal reflectors embodying a homogeneous monocrystal structure at their extreme surface and hence optimal thermal conductivity are particularly useful for $CO_2$-lasers and other high-efficiency lasers.

I claim:

1. In a method for manufacturing monocrystal reflectors of copper, silver or gold for laser applications the the improvement comprising producing copper, silver, or gold monocrystals for use as such reflectors, said crystals having a uniformly smooth finished reflecting surface with unworked monocrystal structure, using a crucible polished to optical quality on the surface thereof in contact with the reflecting surface of the monocrystal.

2. A method as claimed in claim 1 wherein monocrystals incorporating opposite reflecting surfaces are produced using a crucible incorporating opposed polished inside surfaces.

3. A method as claimed in claim 1, comprising producing, in a crucible polished on at least one inside surface thereof, a monocrystal whose length is a multiple of the length of the reflector to be made and subsequently separating the monocrystal into several reflectors.

* * * * *